(12) United States Patent
Kim et al.

(10) Patent No.: US 11,216,728 B2
(45) Date of Patent: Jan. 4, 2022

(54) WEIGHT MATRIX CIRCUIT AND WEIGHT MATRIX INPUT CIRCUIT

(71) Applicant: POSTECH ACADEMY-INDUSTRY FOUNDATION, Pohang-si (KR)

(72) Inventors: Jae-Joon Kim, Pohang-si (KR); Taesu Kim, Incheon (KR); Hyungjun Kim, Pohang-si (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 136 days.

(21) Appl. No.: 16/450,968

(22) Filed: Jun. 24, 2019

(65) Prior Publication Data

US 2019/0392316 A1 Dec. 26, 2019

(30) Foreign Application Priority Data

Jun. 25, 2018 (KR) .................. 10-2018-0072808

(51) Int. Cl.
*G06N 3/08* (2006.01)
*G11C 13/00* (2006.01)
*G11C 11/16* (2006.01)
*G11C 11/22* (2006.01)

(52) U.S. Cl.
CPC .......... *G06N 3/08* (2013.01); *G11C 13/0021* (2013.01); *G11C 11/165* (2013.01); *G11C 11/225* (2013.01); *G11C 13/0004* (2013.01); *G11C 2213/15* (2013.01)

(58) Field of Classification Search
CPC . G11C 13/0021; G11C 11/165; G11C 11/225; G11C 2213/15

USPC ......................................... 365/148, 145, 130
See application file for complete search history.

(56) References Cited

U.S. PATENT DOCUMENTS

| | | | |
|---|---|---|---|
| 10,366,752 B2 * | 7/2019 | Ramadan | G11C 13/0061 |
| 10,970,441 B1 * | 4/2021 | Zhang | G06N 3/0472 |
| 2011/0026299 A1 * | 2/2011 | Kanno | G11C 13/0061 365/148 |
| 2016/0078935 A1 * | 3/2016 | Zaitsu | G11C 13/003 365/148 |
| 2017/0316827 A1 * | 11/2017 | Ge | G11C 13/0007 |
| 2018/0018559 A1 * | 1/2018 | Yakopcic | G06F 17/10 |

(Continued)

FOREIGN PATENT DOCUMENTS

KR 10-2008-0039829 A 10/2010

OTHER PUBLICATIONS

Taesu Kim, et al, "Input Voltage Mapping Optimized for Resistive Memory-Based Deep Neural Network Hardware," IEEE Electron Device Letters, vol. 38, No. 9, Sep. 2017, pp. 1228-1231.

*Primary Examiner* — Connie C Yoha
(74) *Attorney, Agent, or Firm* — Morgan, Lewis & Bockius LLP

(57) ABSTRACT

Provided are a weight matrix circuit and a weight matrix input circuit. The weight matrix circuit includes a memory array including n input lines, m output lines, and n×m resistive memory devices each connected to the n input lines and the m output lines and each having a non-linear current-voltage characteristic, an input circuit connected to each of the input lines, and an output circuit connected to each of the output lines. The input circuit is connected to the resistive memory devices such that the weight matrix circuit has a linear current-voltage characteristic.

6 Claims, 5 Drawing Sheets

(56) References Cited

U.S. PATENT DOCUMENTS

2019/0311018 A1* 10/2019 Kendall ............. G11C 13/0028
2020/0160160 A1* 5/2020 Kim ...................... G06N 3/063

* cited by examiner (A)

WEIGHT MATRIX CIRCUIT AND WEIGHT MATRIX INPUT CIRCUIT

CROSS-REFERENCE TO RELATED APPLICATION

This application claims priority to and the benefit of Korean Patent Application No. 10-2018-0072808, filed on Jun. 25, 2018, the disclosure of which is incorporated herein by reference in its entirety.

BACKGROUND

1. Field of the Invention

The present invention relates to a weight matrix circuit and a weight matrix input circuit.

2. Discussion of Related Art

To overcome structural limitations of chips based on existing Von Neumann architecture, integrated chip (IC) development companies have been developing neural network hardware or neuromorphic hardware based on neural networks composed of neurons which are fundamental units of a human brain, synapses which connect the neurons to each other, and the like. Neural networks overcome limitations of existing machine learning algorithms and exhibit capabilities of learning and recognizing images, videos, and patterns at a level close to a human. These days, neural networks are being used in a number of fields. Numerous companies and researchers are developing dedicated application specific integrated chips (ASICs) to rapidly perform calculation of such a neural network with lower power.

Like a human brain, a neural network is formed of neurons connected to each other and performs learning and inference. The neural network includes the neurons and synapses connecting the neurons. The degree of connectivity between neurons may be strong or weak and is referred to as weight.

Training a neural network is a process of controlling a weight value until a target value is output when data to be learned is input to the formed network.

The process of training a neural network may be illustrated as a process of representing weight values between n neurons and m neurons as an n×m weight matrix and changing element values of the matrix. Also, a process of performing inference using a neural network may be illustrated as a process of multiplying a vector provided by a neuron and a weight matrix together.

The process of training a neural network or performing inference using a neural network is to repeatedly perform numerous multiplications. It is preferable to implement the process with dedicated hardware in terms of power consumption and calculation speed.

SUMMARY OF THE INVENTION

When a weight matrix is implemented using an array of resistive memories, it is possible to multiply a vector and the weight matrix together by applying a voltage corresponding to the vector to the array of resistive memories and then measuring a current. Here, a vector-voltage conversion circuit is designed assuming that resistive memories have a linear current-voltage characteristic. However, resistive memory devices have a non-linear current-voltage characteristic.

For this reason, calculations are not accurately performed even when a target weight value is accurately input to a memory device. This has influence on accuracy in training and inference, speed of training and inference, and power consumption.

The present invention is directed to reducing the non-linearity of a current-voltage characteristic of resistive memories when a weight matrix is implemented using the resistive memories.

According to an aspect of the present invention, there is provided a weight matrix circuit including: a memory array configured to include n input lines, m output lines, and n×m resistive memory devices each connected to the n input lines and the m output lines and each having a non-linear current-voltage characteristic; an input circuit configured to be connected to each of the input lines; and an output circuit configured to be connected to each of the output lines. The input circuit is connected to the resistive memory devices such that the weight matrix circuit has a linear current-voltage characteristic.

According to another aspect of the present invention, there is provided a weight matrix input circuit for providing an input to a weight matrix circuit which stores weight values between neurons of a neural network, the weight matrix input circuit including: an operational amplifier (OP-amp) having an inverting input electrode, a non-inverting input electrode, and an output electrode; a resistor connected to the inverting input electrode; and a resistive memory device having an end connected to the inverting input electrode and an end connected to the output electrode. The weight matrix circuit connected to the weight matrix input circuit has a linear current-voltage characteristic.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

The following descriptions of the present invention are merely exemplary embodiments for structural or functional descriptions, and the scope of the present invention should not be construed as being limited to the exemplary embodiments set forth herein. In other words, exemplary embodiments may be diversely changed and have various forms, and the scope of the present invention should be understood as including equivalents thereto to realize the technical idea.

Meanwhile, terminology described in this application is to be understood as follows.

It is to be understood that the singular forms include the plural forms unless the context clearly indicates otherwise. The terms "include," "have," or the like when used in this specification, specify the presence of stated features, numbers, operations, elements, parts, or combinations thereof but do not preclude the presence or addition of one or more other features, numbers, operations, elements, parts, or combinations thereof.

Unless a specific sequence is clearly mentioned in the context, respective steps may be performed out of the order noted in a flowchart. In other words, respective steps may be performed in the same order as stated, substantially concurrently, or in the reverse order.

Unless otherwise defined, all terms used herein have the same meaning as commonly understood by those of ordinary skill in the art to which the present invention belongs. Terms generally used, like those defined in a dictionary, should be interpreted to match the contextual meaning of related technology and should not be interpreted in an idealized or overly formal sense unless clearly so defined herein.

Figure 1:
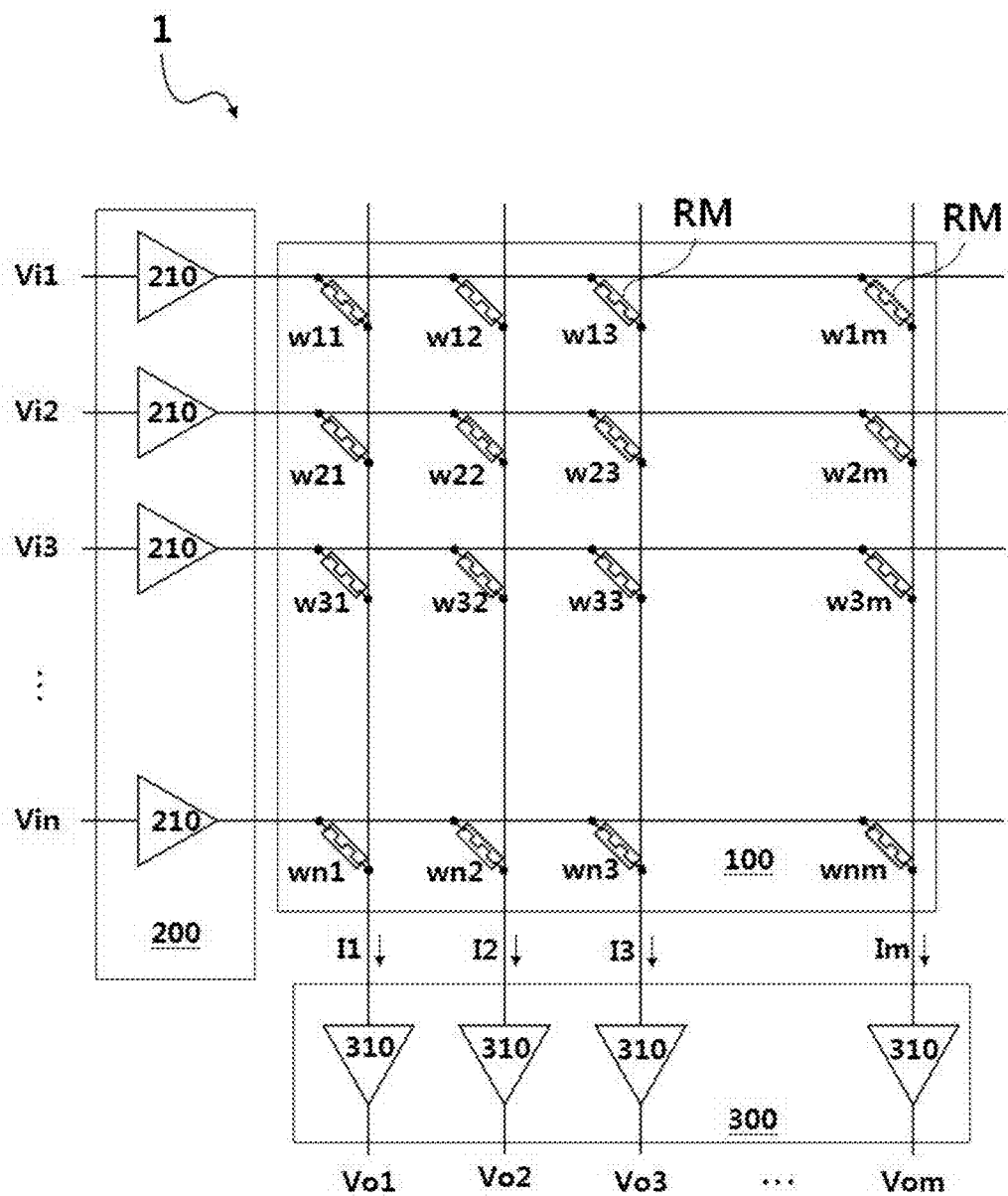
FIG. 1 is a diagram showing an overview of a weight matrix circuit according to an exemplary embodiment of the present invention.

Hereinafter, exemplary embodiments of the present invention will be described with reference to the accompanying drawings. FIG. 1 is a diagram showing an overview of a weight matrix circuit 1 according to an exemplary embodiment of the present invention. Referring to FIG. 1, the weight matrix circuit 1 includes a memory array 100 including n input lines, m output lines, and n×m resistive memory devices RM which are each connected to the n input lines and the m output lines and have a non-linear current-voltage characteristic, an input circuit 200 connected to each of the input lines, and an output circuit 300 connected to each of the output lines. The input circuit is connected to the resistive memory devices RM such that the weight matrix circuit 1 has a linear current-voltage characteristic.

The memory array 100 includes the resistive memory devices RM connected to the plurality of input lines and the plurality of output lines, and the resistive memory devices RM are arranged in an array form. The resistive memory devices RM store weight values w11, w21, . . . , and wnm which indicate strengths of connections between neurons. Therefore, the memory array 100 exemplified in FIG. 1 may store weight values for connecting n neurons and m neurons. A larger weight value may indicate a stronger connection between neurons, and a smaller weight value may indicate a weaker connection between neurons.

For example, when a voltage input signal Vi2 is provided to a second row of the memory array 100, currents I1, I2, I3, . . . , and Im are output according to the weight values w21, w22, w23, . . . , and w2m stored in memory devices, and the current values output from the memory array 100 correspond to products of the weight values w21, w22, w23, . . . , and w2m stored in the memory devices and the input.

According to an exemplary embodiment, the resistive memory devices RM may be any one selected from among the group of a resistive random access memory (RRAM), a magnetic random access memory (MRAM), a phase-change random access memory (PCRAM), and a ferroelectric random access memory (FeRAM).

Figure 2:
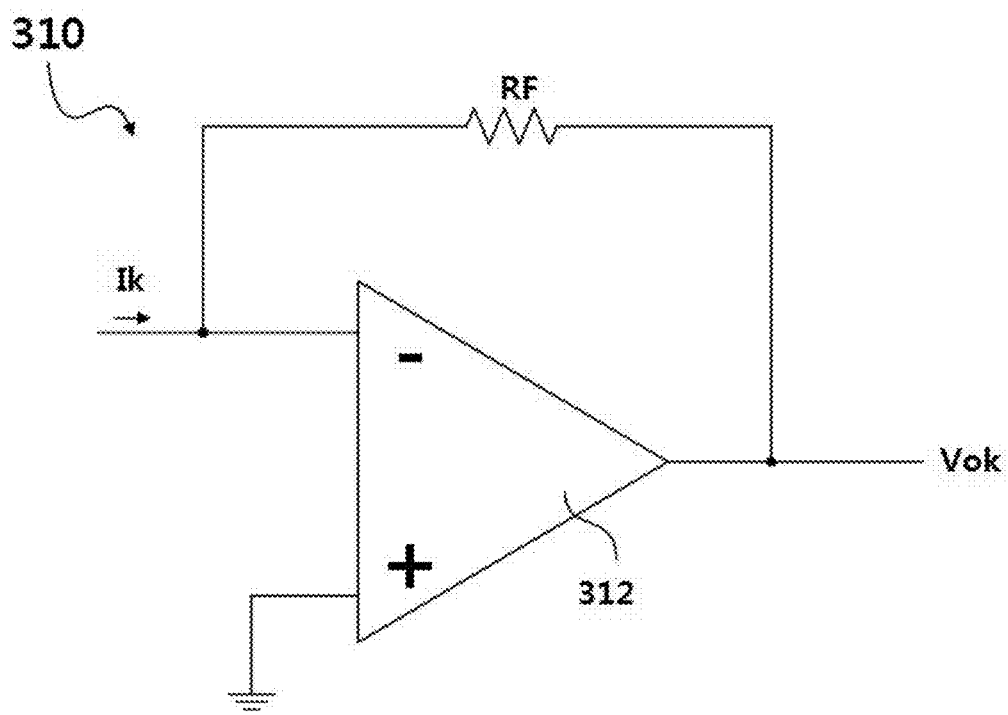
FIG. 2 is a diagram showing an overview of a conversion circuit included in an output circuit according to an exemplary embodiment of the present invention.

FIG. 2 is a diagram showing an overview of a conversion circuit 310 included in the output circuit 300 according to an exemplary embodiment of the present invention. Referring to FIG. 2, the conversion circuit 310 includes an operational amplifier (OP-amp) 312 and a resistor RF having one end and the other end each connected to an inverting input and an output of the OP-amp 312. A non-inverting input of the OP-amp 312 is connected to a reference voltage. An input current IK is provided through a node at which the OP-amp 312 and the resistor RF are connected, and the OP-amp 312 converts the input current IK into a corresponding voltage signal Vok and outputs the voltage signal Vok.

Figure 3:
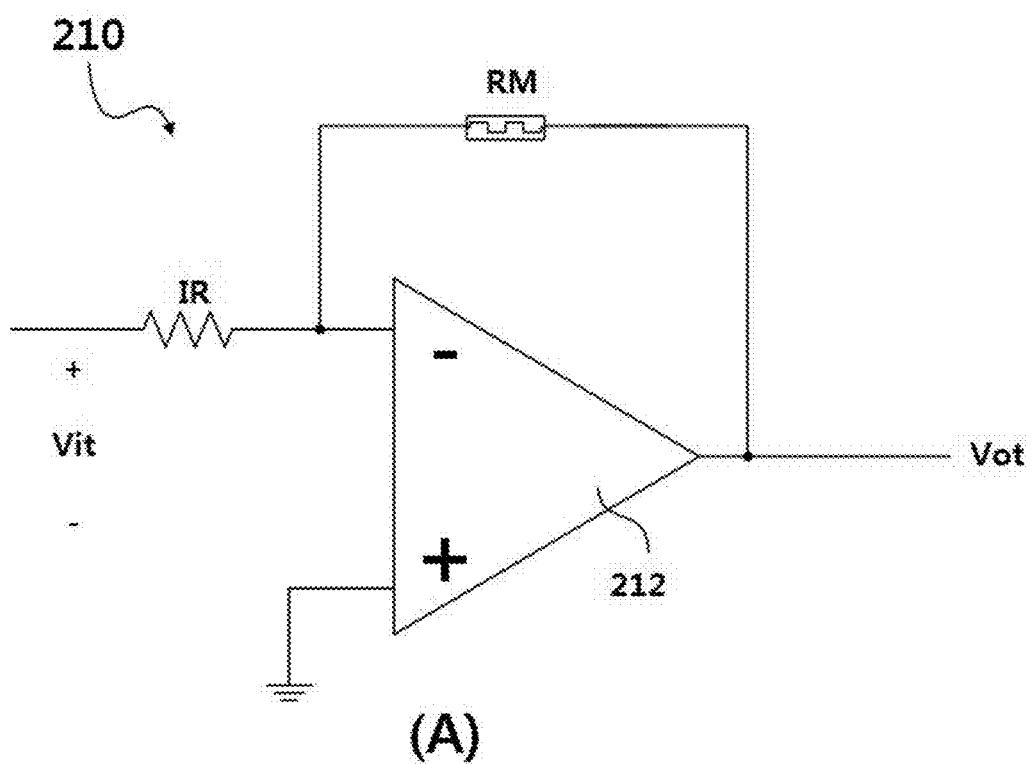
FIG. 3 is a diagram showing an overview of a weight matrix input circuit included in an input circuit according to an exemplary embodiment of the present invention.

FIG. 3 is a diagram showing an overview of a weight matrix input circuit 210 included in the input circuit 200 according to an exemplary embodiment of the present invention. Referring to FIG. 3, the weight matrix input circuit 210 includes an OP-amp 212 having an inverting input electrode, a non-inverting input electrode, and an output electrode, a resistor IR connected to the inverting input electrode, and a resistive memory device RM having ends each connected to the inverting input electrode and the output electrode.

According to an exemplary embodiment, the memory device RM included in the weight matrix input circuit 210 may be any one selected from among the group of an RRAM, an MRAM, a PCRAM, and a FeRAM and may be the same device as the resistive memory devices included in the memory array 100.

Figure 4B:
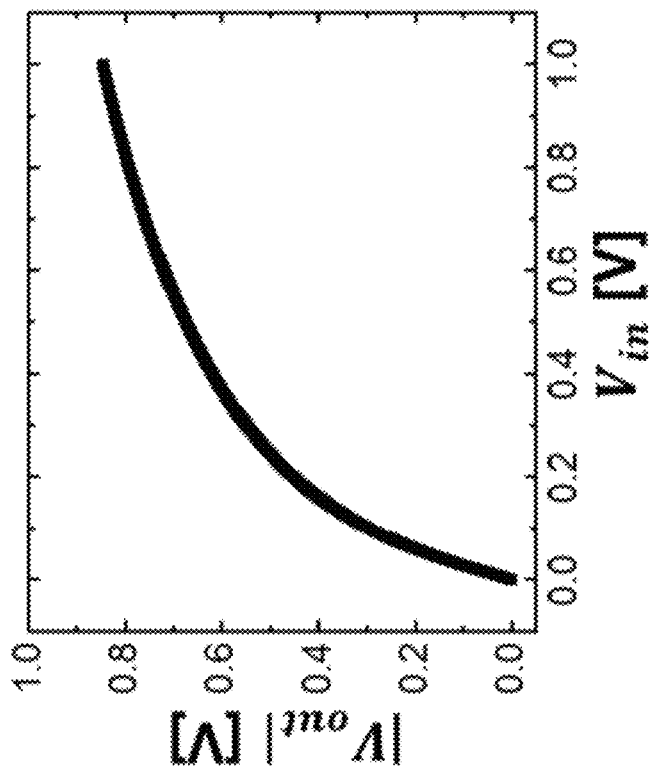
FIG. 4B is a graph schematically showing a current-voltage characteristic of an input circuit.
Figure 4A:
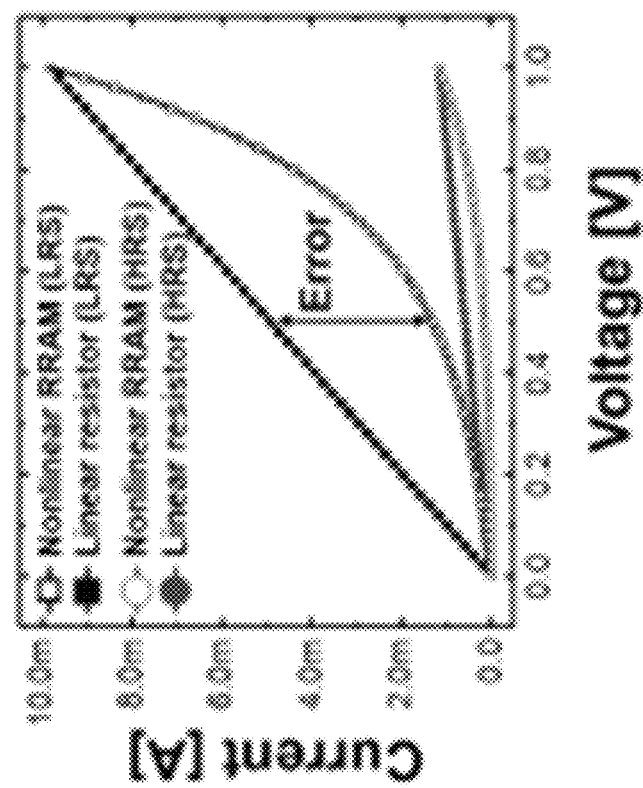
FIG. 4A is a graph showing a current-voltage characteristic of resistive memory devices included in a memory array.

Operation of the weight matrix circuit 1 having the above-describe configuration will be described from now. FIG. 4A is a graph showing a current-voltage characteristic of resistive memory devices RM included in the memory array 100. Referring to FIG. 4A, a current-voltage characteristic of the resistor which is a passive device is shown as a straight line, but a current-voltage characteristic of the resistive memory devices RM is not linear. The current-voltage characteristic of the resistive memory devices RM may be mathematically modeled as a hyperbolic sine function as shown in Equation 1 below.

$$I = G \sinh(BV) \qquad \text{[Equation 1]}$$

(I: current, V: voltage, B: constant, G: conductance)

A current-voltage characteristic of the weight matrix input circuit 210 shown in FIG. 3 is as follows. When an arbitrary input voltage Vit is given as an input and a conductance of the resistive memory device RM is Gt, a voltage Vot of the output terminal obtained according to characteristics of the circuit 210 employing the input resistor IR and the OP-amp 212 is determined to be an inverse function of the current-voltage characteristic of the resistive memory device RM. This may be represented as shown in Equation 2 below and schematically depicted as shown in FIG. 4B.

$$Vot = \frac{1}{B} \operatorname{arcsinh}\left(\frac{Vit}{G_t R}\right) \qquad \text{[Equation 2]}$$

Therefore, when the output voltage Vot is input to another resistive memory device RM which has been set to have a conductance G, a current flowing through the memory device RM may be calculated as shown in Equation 3 below, and it is possible to obtain a linear current-to-voltage characteristic as shown in Equation 3.

$$Iit = \frac{G}{G_t R} Vit \qquad \text{[Equation 3]}$$

Implementation Example and Experimental Example

Figures 5A, 5B, 5C:
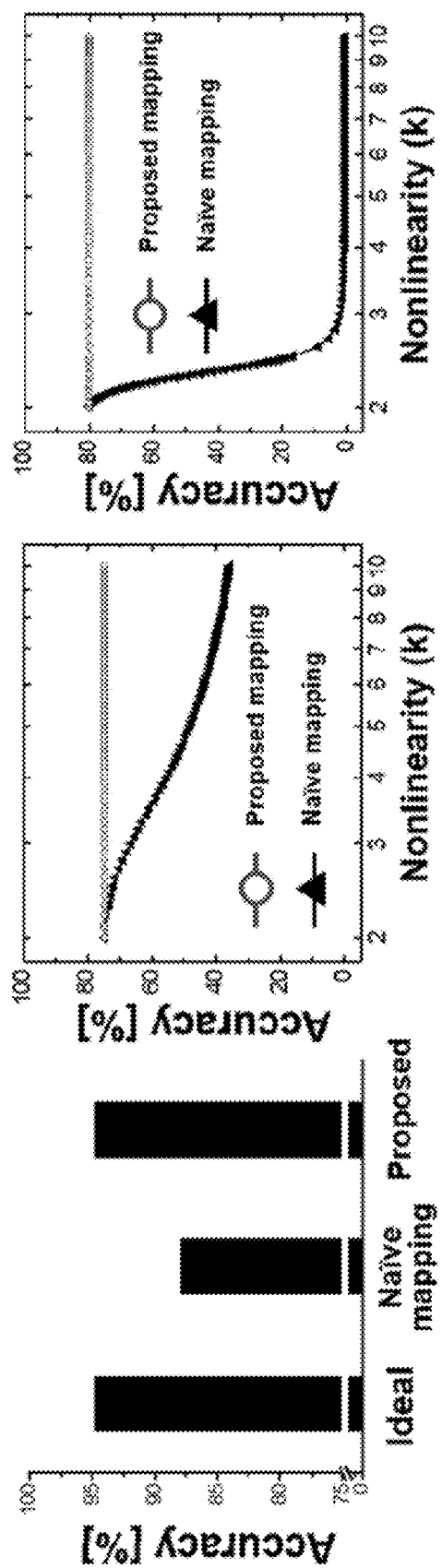
FIGS. 5A, 5B and 5C illustrate a set of graphs in which a weight matrix circuit including an input circuit according to an exemplary embodiment of the present invention is compared with a weight matrix circuit according to related art.

FIGS. 5A, 5B and 5C illustrate a set of graphs in which a weight matrix circuit including an input circuit according to an exemplary embodiment of the present invention is compared with a weight matrix circuit according to related art. Multi-layer perception (MLP) training was performed to classify a modified national institute of standards and technology (MNIST) data set such that effects of the exemplary embodiment of the present invention were verified. Training and determination were performed with MATLAB. FIG. 5A is a graph for comparing accuracy of an ideal case Ideal, accuracy of a case Naïve of the related art, and an accuracy of a case Proposed of the exemplary embodiment of the present invention. While there was an accuracy of 88% in the case of the related art, there was an accuracy of 94.81% in the case of the exemplary embodiment of the present invention.

Convolutional neural networks (CNNs) were used to classify complex images such that classification accuracy results of the three cases were compared. FIGS. 5B and 5C show calculation simulation results of LeNet and AlexNet for classifying the Canadian institute for advanced research (CIFAR)-10 and ImageNet data sets.

Referring to FIGS. 5B and 5C, when non-linearity increases, accuracy in data set classification of the related art was reduced (black). On the other hand, according to the exemplary embodiment of the present invention, accuracy in data set classification was maintained at a fixed level regardless of an increase in non-linearity.

An input circuit according to an exemplary embodiment of the present invention is designed using a resistive memory device to have an output voltage which corresponds to an inverse function of a non-linear current-voltage characteristic of the resistive memory device with respect to an arbitrary input voltage. Therefore, the input circuit according to an exemplary embodiment of the present invention compensates for a non-linear current-voltage characteristic of resistive memory devices included in a memory array, and accordingly, it is possible to improve calculation accuracy of an artificial neural network circuit employing the memory device.

According to an exemplary embodiment of the present invention, it is possible to provide a linear current-voltage characteristic of a weight matrix such that a weight value can be easily controlled. Due to this characteristic, it is possible to improve accuracy in training and inference and speed of training and inference and to lower power consumption.

Although exemplary embodiments of the present invention have been described in detail with reference to the accompanying drawings, the embodiments are merely examples, and those of ordinary skill in the art will appreciate that various modifications and equivalents may be made from the exemplary embodiments. Therefore, the technical scope of the present invention should be determined by the following claims.

What is claimed is:

1. A weight matrix circuit comprising:
    a memory array configured to include n input lines, m output lines, and nxm resistive memory devices each connected to the n input lines and the m output lines and each having a non-linear current-voltage characteristic;
    an input circuit configured to be connected to each of the input lines; and
    an output circuit configured to be connected to each of the output lines,
    wherein the input circuit is connected to the resistive memory devices such that the weight matrix circuit has a linear current-voltage characteristic, and
    wherein the input circuit comprises:
        an operational amplifier (OP-amp) having an inverting input electrode, a non-inverting input electrode, and an output electrode;
        a resistor connected to the inverting input electrode; and
        a resistive memory device having ends which are connected to the inverting input electrode and the output electrode.

2. The weight matrix circuit of claim 1, wherein the resistive memory devices are any one selected from the group consisting of a resistive random access memory (RRAM), a magnetic random access memory (MRAM), a phase-change random access memory (PCRAM), and a ferroelectric random access memory (FeRAM).

3. The weight matrix circuit of claim 1, wherein the non-linear current-voltage characteristic of the resistive memory devices is modeled as a hyperbolic sine function (sinhx) with respect to a provided voltage.

4. The weight matrix circuit of claim 1, wherein the input circuit is modeled as an inverse function of a current-voltage characteristic of the resistive memory devices.

5. A weight matrix input circuit for providing an input to a weight matrix circuit which stores weight values between neurons of a neural network, the weight matrix input circuit comprising:
    an operational amplifier (OP-amp) having an inverting input electrode, a non-inverting input electrode, and an output electrode;
    a resistor connected to the inverting input electrode; and
    a resistive memory device having ends connected to the inverting input electrode and the output electrode,
    wherein the weight matrix circuit connected to the weight matrix input circuit has a linear current-voltage characteristic.

6. The weight matrix input circuit of claim 5, wherein the current-voltage characteristic of the weight matrix circuit is modeled as a hyperbolic sine function, and
    a current-voltage characteristic of the weight matrix input circuit is modeled as an inverse function of the hyperbolic sine function.

* * * * *